(12) United States Patent
Li et al.

(10) Patent No.: US 12,283,517 B2
(45) Date of Patent: Apr. 22, 2025

(54) METHOD FOR FORMING SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Pengchong Li, Shanghai (CN); Xuejie Shi, Shanghai (CN); Hansu Oh, Shanghai (CN); Bo Su, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 836 days.

(21) Appl. No.: 17/520,967

(22) Filed: Nov. 8, 2021

(65) Prior Publication Data

US 2022/0199460 A1    Jun. 23, 2022

(30) Foreign Application Priority Data

Dec. 18, 2020   (CN) .......................... 202011506507.6

(51) Int. Cl.
*H10D 30/43*     (2025.01)
*H01L 21/265*    (2006.01)
(Continued)

(52) U.S. Cl.
CPC .. *H01L 21/76237* (2013.01); *H01L 21/26513* (2013.01); *H10D 30/024* (2025.01);
(Continued)

(58) Field of Classification Search
None
See application file for complete search history.

(56) References Cited

U.S. PATENT DOCUMENTS

2019/0371679 A1* 12/2019 Wang ................ H01L 21/26513
2020/0006559 A1*  1/2020 Mehandru .......... H01L 29/6653
(Continued)

FOREIGN PATENT DOCUMENTS

WO   WO-2020087387 A1 *  5/2020   ......... H01L 21/0259

OTHER PUBLICATIONS

WO2020/087387A1 Machine translation from the European Patent Office (EPO) on Nov. 16, 2024, pp. 1-34 (Year: 2024).*

*Primary Examiner* — Joseph C. Nicely
*Assistant Examiner* — Lamont B Koo
(74) *Attorney, Agent, or Firm* — Crowell & Moring LLP (57) ABSTRACT

A method for forming a semiconductor structure is provided. In one form, a method includes: providing a base, a dummy gate structure, a source-drain doped region, and an interlayer dielectric layer; removing the dummy gate structure located at an isolation region to form an isolation opening; performing first ion doping on a fin below the isolation opening, to form an isolation doped region, where a doping type of the isolation doped region is different from a doping type of the source-drain doped region; filling an isolation structure in the isolation opening; removing the remaining dummy gate structure, to form a gate opening; and forming a gate structure in the gate opening. In embodiments and implementations of the present disclosure, the isolation doped region with a doping type different from that of the source-drain doped region is formed, so that a doping concentration of opposite-type ions in the fin of the isolation region can be improved, thereby accordingly improving a potential energy barrier of a P-N junction formed by the source-drain doped region and the fin of the isolation region, to prevent a conduction current from being generated in the fin of the isolation region when a device is working, and implementing isolation between the fin in the isolation region and the (Continued)

fin in other regions. Moreover, there is no need to perform a fin cut process, so that the fin is a continuous structure, to prevent stress release in the fin.

18 Claims, 7 Drawing Sheets

(51) Int. Cl.
    *H01L 21/762* (2006.01)
    *H10D 30/01* (2025.01)
    *H10D 64/01* (2025.01)
    *H10D 84/01* (2025.01)
    *H10D 84/03* (2025.01)

(52) U.S. Cl.
    CPC ....... *H10D 64/017* (2025.01); *H10D 84/0151* (2025.01); *H10D 84/0158* (2025.01); *H10D 84/038* (2025.01)

(56) References Cited

U.S. PATENT DOCUMENTS

| | | | |
|---|---|---|---|
| 2022/0068907 A1* | 3/2022 | Tura | B82Y 40/00 |
| 2022/0123111 A1* | 4/2022 | Wang | H01L 21/823871 |

* cited by examiner

METHOD FOR FORMING SEMICONDUCTOR STRUCTURE

RELATED APPLICATIONS

The present application claims priority to Chinese Patent Appln. No. 202011506507.6, filed Dec. 18, 2020, the entire disclosure of which is hereby incorporated by reference.

BACKGROUND

Technical Field

Embodiments and implementations of the present disclosure relate to the field of semiconductor manufacturing, and in particular, to a method for forming a semiconductor structure.

Related Art

In semiconductor manufacturing, with the development of very large scale integrated circuits, a feature size of an integrated circuit continues to decrease. To adapt to a smaller feature size, a channel length of a metal-oxide-semiconductor field-effect transistor (MOSFET) also continues to decrease. Further, as a channel length of a device becomes smaller, a distance between a source and a drain of the device also accordingly decreases. Therefore, a channel control capability of a dummy gate structure deteriorates, and it becomes increasingly difficult for a gate voltage to pinch off a channel, resulting in a greater possibility of subthreshold leakage, that is, the so-called short-channel effect (SCE) is more likely to occur.

Therefore, to reduce impact of the short-channel effect, semiconductor processes gradually are transitioning from a planar MOSFET to a three-dimensional transistor with higher efficiency, such as a fin field effect transistor (FinFET). In the FinFET, a dummy gate structure may control an ultra-thin body (a fin) from at least two sides, and compared with the planar MOSFET, the dummy gate structure has a higher channel control capability, and can suppress the short-channel effects adequately. Moreover, compared with other devices, the FinFET has better compatibility with manufacturing of existing integrated circuits.

However, at present, performance of a FinFET still needs to be improved.

SUMMARY

A problem to be addressed in the present disclosure is to provide a method for forming a semiconductor structure to improve performance of a FinFET.

To address the foregoing problem, the present disclosure provides a method for forming a semiconductor structure. In one form, a method for forming a semiconductor structure includes: providing a base, including an isolation region corresponding to a fin cut position, where the base includes a substrate and a fin protruding from the substrate, a dummy gate structure extending across the fin formed on the substrate, a source-drain doped region formed in the fin on two sides of the dummy gate structure, and an interlayer dielectric layer covering a side wall of the dummy gate structure and the source-drain doped region formed on the substrate; removing the dummy gate structure located at the isolation region, to form an isolation opening, to expose a top and a side wall of the fin located at the isolation region; performing first ion doping on the fin below the isolation opening, to form an isolation doped region in the fin, where a doping type of the isolation doped region is different from a doping type of the source-drain doped region; filling an isolation structure in the isolation opening after the first ion doping is performed, where the isolation structure extends across the fin of the isolation region; removing the remaining dummy gate structure after the isolation structure is formed, to form a gate opening in the interlayer dielectric layer; and forming a gate structure in the gate opening.

In some implementations, the source-drain doped region is N-type doping, the fin below the isolation opening is doped with P-type ions, and the P-type ions include boron ions, gallium ions or indium ions; or, the source-drain doped region is P-type doping, the fin below the isolation opening is doped with N-type ions, and the N-type ions include phosphorus ions, arsenic ions or antimony ions.

In some implementations, the first ion doping is performed on the fin below the isolation opening by using an ion implantation process.

In some implementations, the source-drain doped region is N-type doping, ions of the ion implantation are boron ions, and parameters of the ion implantation process include: implantation energy of 3 keV to 8 keV, an implantation dose of $2.0E14\ cm^{-2}$ to $1.0E15\ cm^{-2}$; and an implantation angle of 3° to 20°; or, the source-drain doped region is P-type doping, ions of the ion implantation are phosphorus ions, and parameters of the ion implantation process include: implantation energy of 3 keV to 8 keV, an implantation dose of $1.0E14\ cm^{-2}$ to $6.0E14\ cm^{-2}$; and an implantation angle of 3° to 20°.

In some implementations, a process of removing the dummy gate structure located at the isolation region includes a dry etching process.

In some implementations, the method for forming a semiconductor structure further includes: forming a gate dielectric layer on a top surface and the side wall of the fin exposed by the gate opening after the gate opening is formed and before the gate structure is formed.

In some implementations, the gate dielectric layer includes a gate oxide layer.

In some implementations, the method for forming a semiconductor structure further includes: performing a first heat treatment on the gate dielectric layer after the gate dielectric layer is formed and before the gate structure is formed.

In some implementations, a temperature of the first heat treatment is 800° C. to 950° C.

In some implementations, after the gate structure is formed, the method for forming a semiconductor structure further includes: performing a second heat treatment on the isolation doped region.

In some implementations, a temperature of the second heat treatment is 450° C. to 650° C.

In some implementations, the second heat treatment includes: a rapid thermal anneal (RTA) process, a dynamic surface anneal (DSA) process or a laser anneal process.

In some implementations, after the gate structure is formed and before the second heat treatment is performed on the isolation doped region, the method for forming a semiconductor structure further includes: forming a source-drain opening penetrating the interlayer dielectric layer at the top of the source-drain doped region, where the source-drain opening exposes the source-drain doped region; and performing second ion doping on the source-drain doped region exposed by the source-drain opening, where a doping type of the second ion doping is the same as a doping type of the source-drain doped region. After the second heat treatment is performed, the method for forming a semiconductor structure further includes: forming, in the source-drain opening, a source-drain contact layer in contact with the source-drain doped region.

In some implementations, the step of filling an isolation structure in the isolation opening includes: forming an isolation material layer filling the isolation opening, where the isolation material layer is further located on the interlayer dielectric layer and the dummy gate structure; and removing the isolation material layer on the interlayer dielectric layer and a top surface of the dummy gate structure, where the remaining isolation material layer located in the isolation opening is used as the isolation structure.

In some implementations, a process of forming the isolation material layer includes at least one of a chemical vapor deposition (CVD) process, an atomic layer deposition (ALD) process, a flowable chemical vapor deposition (FCVD) process, a plasma-enhanced chemical vapor deposition (PECVD) process, or a high aspect ratio process (HARP).

In some implementations, the isolation material layer on the interlayer dielectric layer and the top surface of the dummy gate structure is removed using a planarization process.

In some implementations, a process temperature of performing the first ion doping on the fin below the isolation opening is 100° C. to 200° C.

In some implementations, a material of the isolation structure includes at least one of silicon oxide, silicon nitride, silicon oxynitride, silicon oxycarbide, silicon carbonitride, or silicon oxycarbonitride.

In some implementations, the gate structure is a metal gate structure.

Compared with the prior art, technical solutions of embodiments and implementations of the present disclosure have at least the following advantages.

In forms of a method for forming a semiconductor structure provided in the present disclosure, the dummy gate structure of the isolation region is removed, to form the isolation opening, the first ion doping is performed on the fin below the isolation opening, to form the isolation doped region in the fin, where the doping type of the isolation doped region is different from the doping type of the source-drain doped region, so that a doping concentration of opposite-type ions in the fin of the isolation region can be improved, thereby also improving a potential energy barrier of a P-N junction formed by the source-drain doped region and the fin of the isolation region, to prevent a conduction current from being generated in the fin of the isolation region when the device is working, and implementing, through ion doping, the isolation between the fin in the isolation region and the fin in other regions. Moreover, in embodiments and implementations of the present disclosure, there is no need to perform a fin cut process, so that the fin is accordingly a continuous structure, to prevent stress release in the fin and improve carrier mobility of a channel. Based on the foregoing, embodiments and implementations of the present disclosure are beneficial to improving the performance of the FinFET.

In addition, in embodiments and implementations of the present disclosure, after the dummy gate structure is formed, the dummy gate structure of the isolation region is removed, to form the isolation opening, and the first ion doping is then performed on the fin below the isolation opening, to form the isolation doped region. Compared with a case that the gate structure is removed to form the isolation opening after the gate structure is formed and the fin below the isolation opening is then doped, in embodiments and implementations of the present disclosure, a procedure of forming the isolation doped region is adjusted forward, to enable the isolation doped region to undergo more process steps, and the subsequent process usually includes a step of a high temperature treatment or a heat treatment, which is beneficial to further diffusing the doped ions in the isolation doped region. Accordingly, a concentration gradient of the doped ions in the isolation doped region is less steep, to slow down a concentration change at a P-N junction interface formed by the source-drain doped region and the fin of the isolation region. Therefore, a tunneling effect from a P-type material to an N-type material is weakened, to reduce a leakage current flowing from the source-drain doped region to the base.

DETAILED DESCRIPTION

It can be learned from the related art that, at present, performance of a FinFET still needs to be improved.

According to analysis, a P-channel metal oxide semiconductor (PMOS) is used as an example. In the FinFET, SiGe is selected as a material of a fin, and compressive stress is provided to a channel of a PMOS device, to improve carrier mobility.

During the formation of the semiconductor structure, a fin cut process is generally further included. After the fin is formed, the fin at an unnecessary position is removed using the fin cut process. However, the fin cut process tends to cause stress release in the fin, resulting in an inadequate effect of improving the carrier mobility.

One method is to cut and remove a fin at an unnecessary position after a dummy gate structure, a source-drain doped region in the fin on two sides of the dummy gate structure, and an interlayer dielectric layer are formed.

Although the method can alleviate the stress release problem in the fin, the fin cut process still causes stress release in the fin, and the performance of the FinFET needs to be improved.

To address the technical problem, in forms of the present disclosure, a method for forming a semiconductor structure is provided, including: providing a base, including an isolation region corresponding to a fin cut position, where the base includes a substrate and a fin protruding from the substrate, a dummy gate structure extending across the fin is formed on the substrate, a source-drain doped region formed in the fin on two sides of the dummy gate structure, and an interlayer dielectric layer covering a side wall of the dummy gate structure and the source-drain doped region formed on the substrate; removing the dummy gate structure located at the isolation region, to form an isolation opening, to expose a top and a side wall of the fin located at the isolation region; performing first ion doping on the fin below the isolation opening, to form an isolation doped region in the fin, where a doping type of the isolation doped region is different from a doping type of the source-drain doped region; filling an isolation structure in the isolation opening after the first ion doping is performed, where the isolation structure extends across the fin of the isolation region; removing the remaining dummy gate structure after the isolation structure is formed, to form a gate opening in the interlayer dielectric layer; and forming a gate structure in the gate opening.

In the method for forming a semiconductor structure provided in forms of the present disclosure, the dummy gate structure of the isolation region is removed, to form the isolation opening, the first ion doping is performed on the fin below the isolation opening, to form the isolation doped region in the fin, where the doping type of the isolation doped region is different from the doping type of the source-drain doped region, so that a doping concentration of opposite-type ions in the fin of the isolation region can be improved, thereby also improving a potential energy barrier of a P-N junction formed by the source-drain doped region and the fin of the isolation region, to prevent a conduction current from being generated in the fin of the isolation region when the device is working, and implementing, through ion doping, the isolation between the fin in the isolation region and the fin in other regions. Moreover, in embodiments and implementations of the present disclosure, there is no need to perform a fin cut process, so that the fin is accordingly a continuous structure, to prevent stress release in the fin and improve carrier mobility of a channel. Based on the foregoing, embodiments and implementations of the present disclosure are beneficial to improving the performance of the FinFET.

In addition, in forms of the present disclosure, after the dummy gate structure is formed, the dummy gate structure of the isolation region is removed, to form the isolation opening, and the first ion doping is then performed on the fin below the isolation opening, to form the isolation doped region. Compared with a case that the gate structure of the isolation region is removed to form the isolation opening after the gate structure is formed and the fin below the isolation opening is then doped, in forms of the present disclosure, a procedure of forming the isolation doped region is adjusted forward, to enable the isolation doped region to undergo more process steps, and the subsequent process usually includes a step of a high temperature treatment or a heat treatment, which is beneficial to further diffusing the doped ions in the isolation doped region. Accordingly, a concentration gradient of the doped ions in the isolation doped region is less steep, to slow down a concentration change at a P-N junction interface formed by the source-drain doped region and the fin of the isolation region. Therefore, a tunneling effect from a P-type material to an N-type material is weakened, to reduce a leakage current flowing from the source-drain doped region to the base.

To make the foregoing objectives, features, and advantages of embodiments and implementations of the present disclosure more obvious and comprehensible, specific embodiments and implementations of the present disclosure are described in detail below with reference to the accompanying drawings.

FIG. 1 to FIG. 14 are schematic structural diagrams corresponding to steps in one form of a method for forming a semiconductor structure according to the present disclosure.

Figure 1:
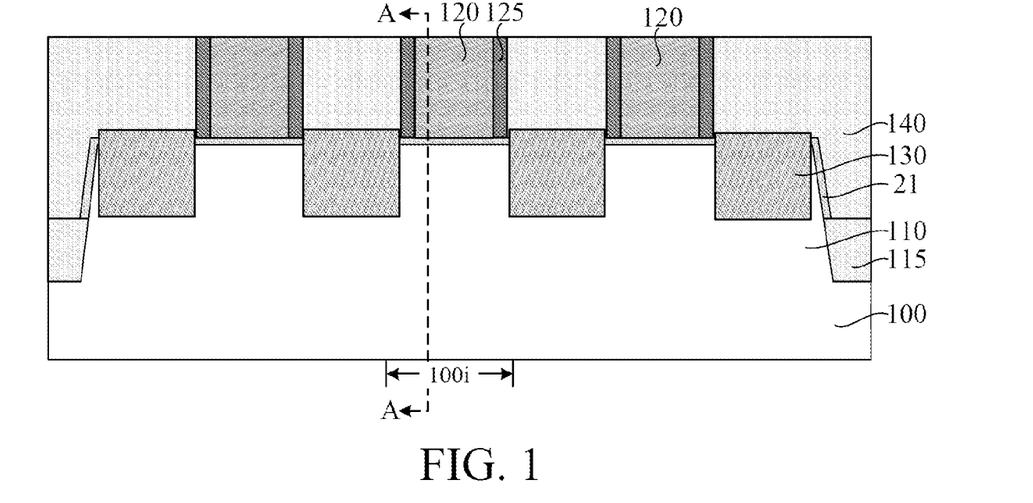
FIG. 1 to FIG. 14 are schematic structural diagrams corresponding to steps in one form of a method for forming a semiconductor structure according to the present disclosure.
Figure 2:
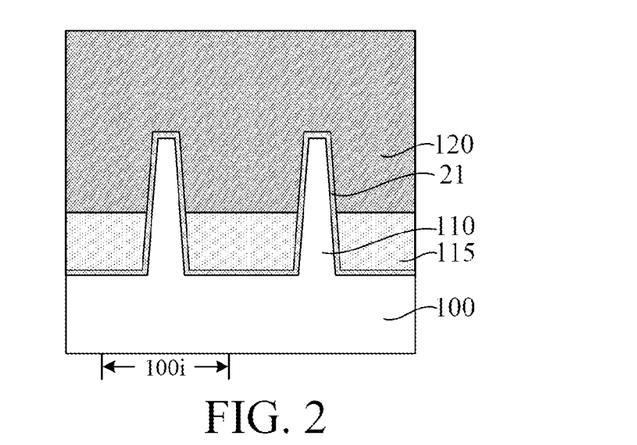

Referring to FIG. 1 and FIG. 2, FIG. 2 is a cross-sectional view in an AA direction of FIG. 1. A base is provided. The base includes an isolation region 100i corresponding to a fin cut position. The base includes a substrate 100 and a fin 110 protruding from the substrate 100, a dummy gate structure 120 extending across the fin 110 is formed on the substrate 100, a source-drain doped region 130 is formed in the fin 110 on two sides of the dummy gate structure 120, and an interlayer dielectric layer 140 covering a side wall of the dummy gate structure 120 and the source-drain doped region 130 is formed on the substrate 100. The base is configured to provide a process platform for subsequent processes.

In this form, the base is configured to form a transistor. The transistor may be one or two of an N-channel metal oxide semiconductor (NMOS) transistor or a PMOS transistor.

In this form, the base is configured to form a FinFET, and the base includes the substrate 100 and the fin 110 protruding from the substrate 100.

In this form, the substrate 100 is a silicon substrate. In other forms, the substrate may be alternatively made of another material such as germanium, silicon germanium, silicon carbide, gallium arsenide, or indium gallium, and the substrate may be alternatively another type of substrate such as a silicon-on-insulator substrate or a germanium-on-insulator substrate. The material of the substrate may be a material suitable for process requirements or easy to integrate.

The fin 110 is configured to provide a conductive channel of a field effect transistor (FET).

In this form, the fin cut process is not needed to implement isolation between the fin 110 in the isolation region 100i and the fin 110 in other regions. The fin 110 is accordingly a continuous structure, to prevent stress release in the fin 110, thereby improving the carrier mobility of the channel.

In the present form, a material of the fin 110 is the same as that of the substrate 100, and the fin 110 is made of silicon. In other forms, the material of the fin may be alternatively a semiconductor material suitable for forming a fin, such as germanium, silicon germanium, silicon carbide, gallium arsenide, or indium gallium.

The isolation region 100i corresponds to the fin cut position, and is configured to define a position of the fin 110 that needs to be isolated.

It should be noted that an isolation layer 115 is further formed on the substrate 100 exposed by the fin 110, and the isolation layer 115 covers a part of a side wall of the fin 110. A top surface of the isolation layer 115 is lower than a top surface of the fin 110.

The isolation layer 115 is configured to isolate adjacent devices. In this form, a material of the isolation layer 115 is silicon oxide. In other forms, the material of the isolation layer may be alternatively another insulation material such as silicon nitride or silicon oxynitride.

The dummy gate structure 120 is configured to occupy a spatial position for subsequent formation of a gate structure.

In this form, the dummy gate structure 120 is located on the isolation layer 115, and covers a part of the top of and a part of the side wall of the fin 110.

The dummy gate structure 120 may be a single-layer structure or a stacked structure.

In this form, the dummy gate structure 120 is a single-layer structure, and the dummy gate structure 120 includes a dummy gate layer. In this form, the material of the dummy gate structure 120 is polysilicon or amorphous silicon.

In this form, a dummy gate oxide layer 21 is further formed on the top surface and the side wall of the fin 110, and the dummy gate structure 120 is accordingly located on the dummy gate oxide layer 21.

In the subsequent step of removing the dummy gate structure 120, the dummy gate oxide layer 21 can define an etching stop position, thereby reducing damage to the fin 110.

In this form, the material of the dummy gate oxide layer 21 is silicon oxide or silicon oxynitride. In this form, a spacer 125 is further formed on a side wall of the dummy gate structure 120.

The spacer 125 is configured to protect the side wall of the dummy gate structure 120, and the spacer 125 is further configured to define a region for forming the source-drain doped region 130.

The material of the spacer 125 may be at least one of silicon oxide, silicon nitride, silicon oxynitride, silicon carbide, silicon oxycarbonitride, silicon oxycarbide, boron nitride, or boron oxycarbide. The spacer 125 may be a single-layer structure or a stacked structure. In this form, the spacer 125 is a single-layer structure, and the material of the spacer 125 is silicon nitride.

The source-drain doped region 130 is configured to provide carriers when the device is working. In this form, the source-drain doped region 130 is further configured to provide stress to the channel, to improve the carrier mobility.

When an NMOS transistor is formed, the source-drain doped region 130 is N-type doping, the source-drain doped region 130 includes a stress layer doped with N-type ions, a material of the stress layer is Si or SiC, and the stress layer provides a tensile stress to a channel region of the NMOS transistor, to improve the carrier mobility of the NMOS transistor, where the N-type ions are P ions, As ions or Sb ions.

When a PMOS transistor is formed, the source-drain doped region 130 is P-type doping, the source-drain doped region 130 includes a stress layer doped with P-type ions, a material of the stress layer is Si or SiGe, and the stress layer provides a pressure stress to a channel region of the PMOS transistor, to improve the carrier mobility of the PMOS transistor, where the P-type ions are B ions, Ga ions or In ions.

The interlayer dielectric layer 140 is configured to isolate adjacent devices. In this form, the interlayer dielectric layer 140 is located on the isolation layer 115 and covers the side wall of the spacer 125.

A material of the interlayer dielectric layer 140 is an insulation material, for example, at least one of silicon oxide, silicon nitride, silicon oxynitride, silicon oxycarbide, silicon carbonitride, or silicon oxycarbonitride. In this form, the interlayer dielectric layer 140 is a single-layer structure, and the material of the interlayer dielectric layer 140 is silicon oxide.

Figure 3:
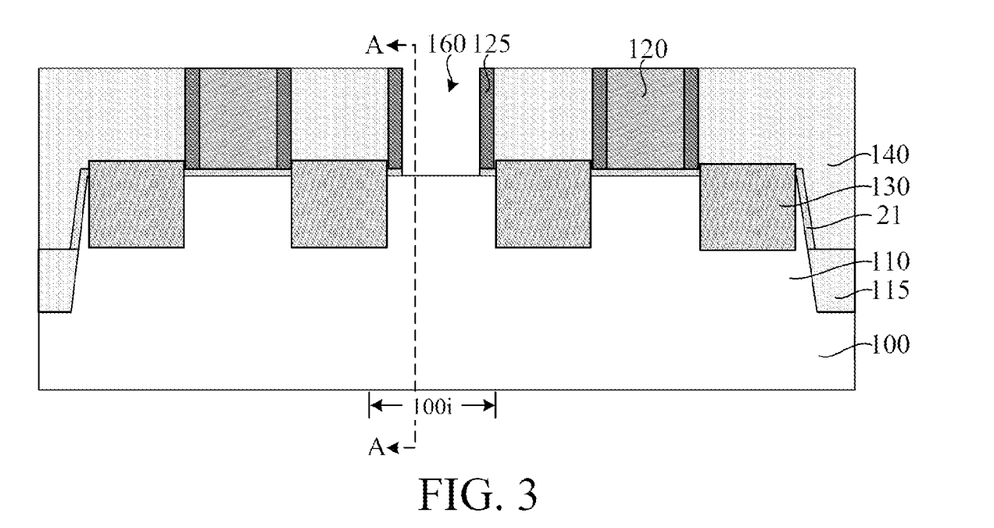
Figure 4:
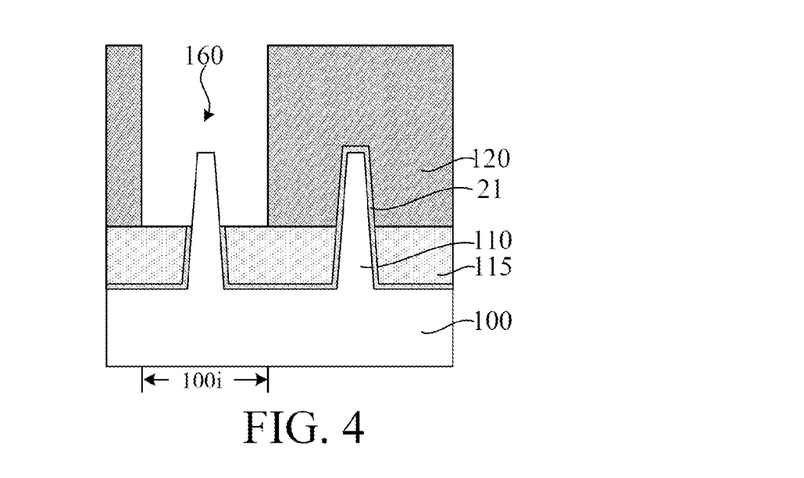

Referring to FIG. 3 and FIG. 4, FIG. 4 is a cross-sectional view in an AA direction of FIG. 3. The dummy gate structure 120 located at the isolation region 100i is removed, to form an isolation opening 160, so that a top and a side wall of the fin 110 located at the isolation region 100i are exposed.

The dummy gate structure 120 located at the isolation region 100i is removed, and the dummy gate structure 120 is disconnected at the isolation region 100i. After the gate structure is subsequently formed at the position of the dummy gate structure 120, the gate structure is accordingly disconnected at the isolation region 100i, so that electrical performance of the device meets design requirements.

The dummy gate structure 120 located at the isolation region 100i is removed, to form the isolation opening 160. The isolation opening 160 exposes the top and the side wall of the fin 110 located at the isolation region 100i, so that doping can be subsequently performed on the fin 110 exposed by the isolation opening 160.

It should be noted that the isolation opening 160 exposes the top and the side wall of the fin 110 located at the isolation region 100i, thereby removing the dummy gate structure 120 at the top and the side wall of the fin 110 located at the isolation region 100i, and preventing a leakage current problem. Moreover, compared with that the isolation opening only exposes the top of the fin of the isolation region, this embodiment is also beneficial to increasing an area of the exposed fin 110, which is beneficial to providing a larger process space for subsequent first ion doping, to improve an isolation effect of the isolation doped region.

In this form, the step of removing the dummy gate structure 120 of the isolation region 100i includes: removing the dummy gate layer of the isolation region 100i using the dummy gate oxide layer 21 of the top surface and the side wall of the fin 110 of the isolation region 100i as a stop layer.

In this form, a process of removing the dummy gate structure 120 at the isolation region 100i includes a dry etching process. In an example, the dry etching process is used for removing the dummy gate structure 120 of the isolation region 110i.

After the dummy gate structure 120 of the isolation region 110i is removed, the method for forming a semiconductor structure further includes: removing the dummy gate oxide layer 21 of the top surface and the side wall of the fin 110 of the isolation region 100i. Specifically, the dry etching process is used for removing the dummy gate oxide layer 21 of the isolation region 110i.

In other forms, according to an actual process requirement, only the dummy gate layer in the isolation region may be removed, and the dummy gate oxide layer in the isolation region is retained.

Figure 5:
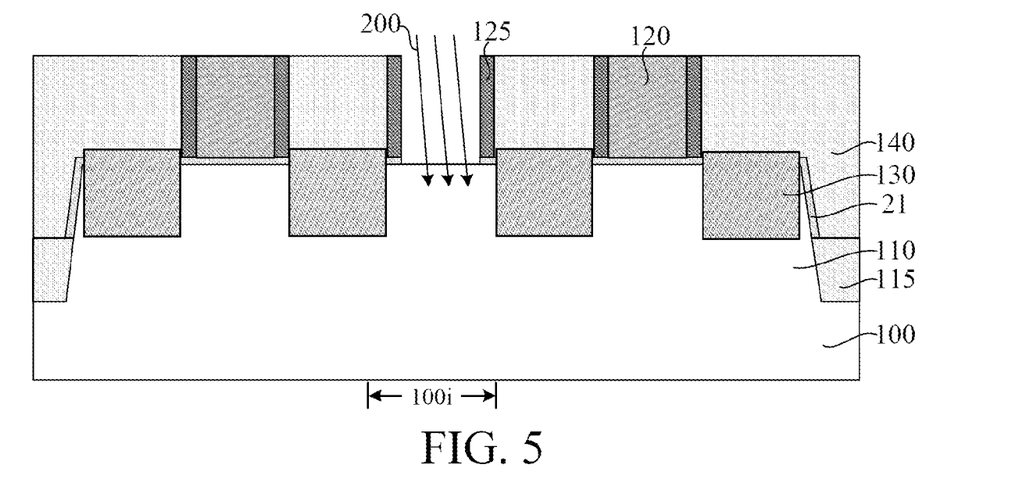
Figure 6:
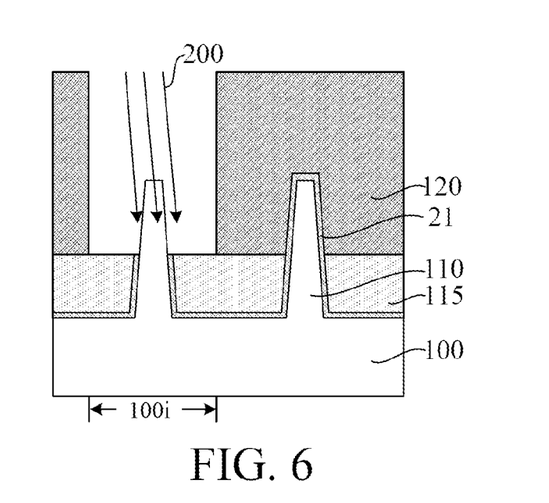

Referring to FIG. 5 and FIG. 6, FIG. 6 is a cross-sectional view of FIG. 5 at a position of the isolation opening 160 in a direction perpendicular to an extending direction of the fin 110. First ion doping 200 is performed on the fin 110 below the isolation opening 160, to form an isolation doped region (not shown in the figure) in the fin 110, where a doping type of the isolation doped region is different from a doping type of the source-drain doped region 130.

The first ion doping 200 is performed on the fin 110 below the isolation opening 160, to form the isolation doped region in the fin 110, where the doping type of the isolation doped region is different from the doping type of the source-drain doped region 130, so that a doping concentration of opposite-type ions in the fin 110 of the isolation region 100i can be improved, thereby accordingly improving a potential energy barrier of a P-N junction formed by the source-drain doped region 130 and the fin 110 of the isolation region 100i, to prevent a conduction current from being generated in the fin 110 of the isolation region 100i when the device is working, and implementing, through ion doping, the isolation between the fin 110 in the isolation region 100i and the fin 110 in other regions. In this form, there is no need to perform the fin cut process, so that the fin 110 is accordingly a continuous structure, to prevent stress release in the fin 110 and improve carrier mobility of the channel. Based on the foregoing, this form is beneficial to improving the performance of the FinFET.

In addition, in this form, after the dummy gate structure 120 is formed, the dummy gate structure 120 of the isolation region 100i is removed, to form the isolation opening 160, and the first ion doping 200 is then performed on the fin 110 below the isolation opening 160, to form the isolation doped region. Compared with a case that the gate structure of the isolation region is removed to form the isolation opening after the gate structure is formed and the fin below the isolation opening is then doped, in this form, a procedure of forming the isolation doped region is adjusted forward, to enable the isolation doped region to undergo more process steps, and the subsequent process usually includes a step of a high temperature treatment or a heat treatment, which is beneficial to further diffusing the doped ions in the isolation doped region. Accordingly, a concentration gradient of the doped ions in the isolation doped region is less steep, to slow down a concentration change at a P-N junction interface formed by the source-drain doped region 130 and the fin 110 of the isolation region 100i. Therefore, a tunneling effect from a P-type material to an N-type material is weakened, to reduce a leakage current flowing from the source-drain doped region 130 to the base.

In this form, the transistor is a PMOS transistor, the source-drain doped region 130 is P-type doping, the fin 110 below the isolation opening 160 is doped with N-type ions, and the N-type ions include phosphorus ions, arsenic ions or antimony ions.

In an example, the transistor is a PMOS transistor, the source-drain doped region 130 is P-type doping, the fin 110 below the isolation opening 160 is doped with phosphorus ions, and a diffusion effect of the phosphorus ions is relatively adequate, and is beneficial to gradually changing the doping concentration of the isolation doped region. Specifically, it is beneficial to gradually changing the doping concentration from a drain region in the source-drain doped region 130 to the substrate 100, thereby improving a band to band tunneling effect, and reducing a band to band tunneling current $I_b$.

In this form, the first ion doping 200 is performed on the fin 110 below the isolation opening 160 using an ion implantation process. The ion implantation process can adjust parameters such as implantation energy, an implantation dose, and an implantation angle, so that a doping profile and a doping concentration of the isolation doped region meet design requirements.

In this form, the source-drain doped region 130 is P-type doping, ions of the ion implantation are phosphorus ions, and parameters of the ion implantation process include: implantation energy of 3 keV to 8 keV, an implantation dose of $1.0E14$ $cm^{-2}$ to $6.0E14$ $cm^{-2}$; and an implantation angle of 3° to 20°.

The implantation energy should neither be excessively low nor excessively high. If the implantation energy is excessively low, an implantation depth of ions tends to be excessively shallow, and the isolation effect of the isolation doped region is likely to decrease. If the implantation energy is excessively high, the implantation depth of the ions tends to be excessively deep, the ion doping concentration in the fin 110 of the isolation region 100i tends to be excessively small, and the isolation effect of the isolation doped region is also likely to decrease. To this end, in this form, the ions of the ion implantation are phosphorus ions, and the implantation energy of the ion implantation process is 3 keV to 8 keV. In this form, a procedure of forming the isolation doped region is adjusted forward, to enable the isolation doped region to undergo more process steps, and the subsequent process usually includes a step of a high temperature treatment or a heat treatment, which is beneficial to further diffusing the doped ions in the isolation doped region. Therefore, the implantation energy may be alternatively appropriately reduced.

The implantation dose should neither be excessively small or excessively large. If the implantation dose is excessively small, the ion doping concentration in the isolation doped region tends to be excessively low, and the isolation effect of the isolation doped region is likely to decrease. If the implantation dose is excessively large, a source region in the source-drain doped region 130 and the carriers in the isolation doped region are likely to increase, the band to band tunneling effect tends to be strengthened and a leakage current from a drain to the substrate 100 is likely to increase. To this end, in this form, the source-drain doped region 130 is P-type doping, ions of the ion implantation are phosphorus ions, and an implantation dose of the ion implantation process is $1.0E14$ $cm^{-2}$ to $6.0E14$ $cm^{-2}$. The implantation dose is set to $1.0E14$ $cm^{-2}$ to $6.0E14$ $cm^{-2}$, the ion doping concentration of the isolation doped region can enable both the band-to-band tunneling current $I_b$ and the source-drain punch current $I_s$ to be relatively small, and the leakage current decreases accordingly, thereby improving the isolation effect of the isolation doped region.

The implantation angle of the ion implantation process should not be excessively large, or otherwise, the implantation ions are likely to be blocked by the interlayer dielectric layer 140 of the side wall of the isolation opening 160 or the dummy gate structure 120, causing an excessively small dose of ions implanted into the fin 110 below the isolation opening 160, and the doping concentration and a doping depth of the isolation doped region can hardly meet the design requirements. To this end, in this form, the ions of the ion implantation are phosphorus ions, and the implantation angle of the ion implantation process is 3° to 20°. It may be learned from the foregoing description that, in this form, a procedure of forming the isolation doped region is adjusted forward, to enable the isolation doped region to undergo more process steps, and the subsequent process usually includes a step of a high temperature treatment or a heat treatment, which is beneficial to further diffusing the doped ions in the isolation doped region. Therefore, the implantation angle may be alternatively appropriately reduced.

In this form, the implantation angle is an angle between an implantation direction and a normal of a surface of the substrate 100. In other forms, when the base is configured to form the NMOS transistor, the source-drain doped region is N-type doping, accordingly, the fin below the isolation opening is doped with P-type ions, and the P-type ions include boron ions, gallium ions or indium ions. In an example, when the base is configured to form the NMOS transistor, the source-drain doped region is N-type doping, ions of the ion implantation are boron ions, and parameters of the ion implantation process include: implantation energy of 3 keV to 8 keV, an implantation dose of $2.0E14$ $cm^{-2}$ to $1.0E15$ $cm^{-2}$; and an implantation angle of 3° to 20°.

In this form, a process temperature of performing the first ion doping 200 on the fin 110 below the isolation opening 160 is higher than the room temperature. The first ion doping is performed at the process temperature higher than the room temperature, thermion implantation can be performed in this form, and is beneficial to increasing movement of ions, to enable the ions to return to a crystal lattice and accordingly reduce damage to the fin 110.

In this form, the process temperature of performing the first ion doping 200 on the fin 110 below the isolation opening 160 is 100° C. to 200° C. The process temperature of the first ion doping 200 is set to 100° C. to 200° C., to further reduce the damage to the fin 110, and to improve process compatibility and reduce thermal budget.

Figure 7:
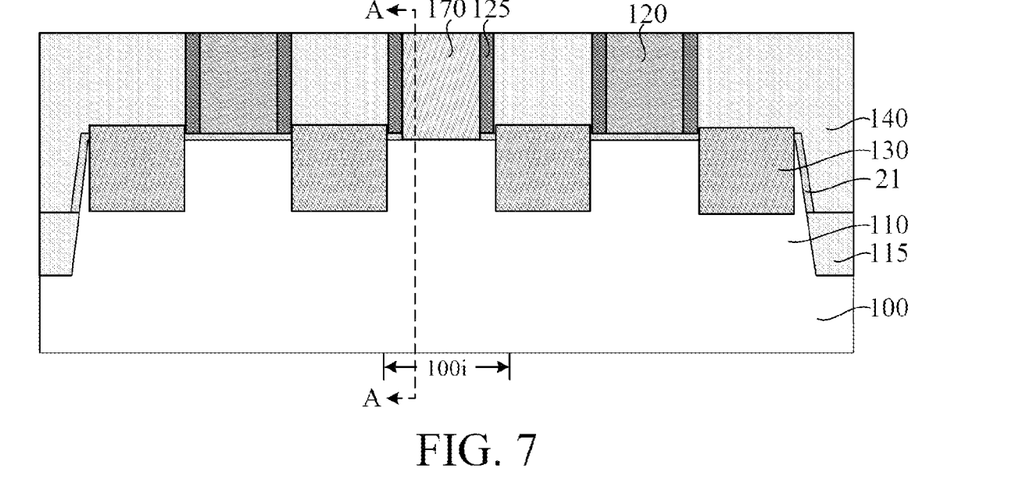
Figure 8:
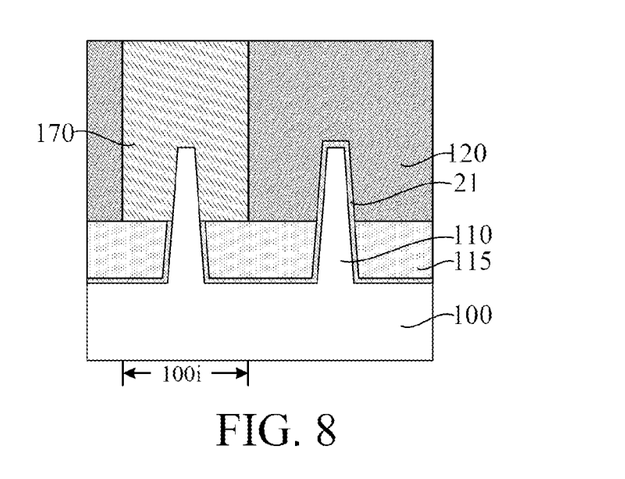

Referring to FIG. 7 and FIG. 8, FIG. 8 is a cross-sectional view in an AA direction of FIG. 7. After the first ion doping 200 is performed, an isolation structure 170 is filled in the isolation opening 160, where the isolation structure 170 extends across the fin 110 of the isolation region 100i.

The isolation structure 170 is configured to isolate the dummy gate structure 120 adjacent to the isolation structure, and after a gate structure is subsequently formed at a position of the dummy gate structure 120, the gate structure adjacent to the isolation structure 170 can be isolated by the isolation structure 170.

Therefore, the isolation structure 170 is made of a dielectric material. A material of the isolation structure 170 includes at least one of silicon oxide, silicon nitride, silicon oxynitride, silicon oxycarbide, silicon carbonitride, or silicon oxycarbonitride.

In this form, the step of forming the isolation structure 170 includes: forming an isolation material layer (not shown in the figure) filling the isolation opening 160, where the isolation material layer is further located on the interlayer dielectric layer 140 and the dummy gate structure 120; and removing the isolation material layer on the interlayer dielectric layer 140 and a top surface of the dummy gate structure 120, where the remaining isolation material layer located in the isolation opening 160 is used as the isolation structure 170.

In this form, a process of forming the isolation material layer includes one or more of a CVD process, an ALD process, an FCVD process, a PECVD process, and a HARP. In an example, the isolation material layer is formed by using the FCVD process. The FCVD process has relatively high flowability, and is suitable for filling gaps with high aspect ratios, to improve filling quality of the isolation material layer in the isolation opening 160 and reduce defects generated in the isolation material layer.

In this form, the isolation material layer on the interlayer dielectric layer 140 and the top surface of the dummy gate structure 120 is removed by using a planarization process. Specifically, the planarization process may be a chemical mechanical planarization process. The chemical mechanical planarization process is a global planarization technology, which is beneficial to improving the degree of planarity of a top surface of the isolation structure 170 and height consistency of the top surface of the interlayer dielectric layer 140 and the isolation structure 170, and the chemical mechanical planarization process has high planarization efficiency.

Figure 9:
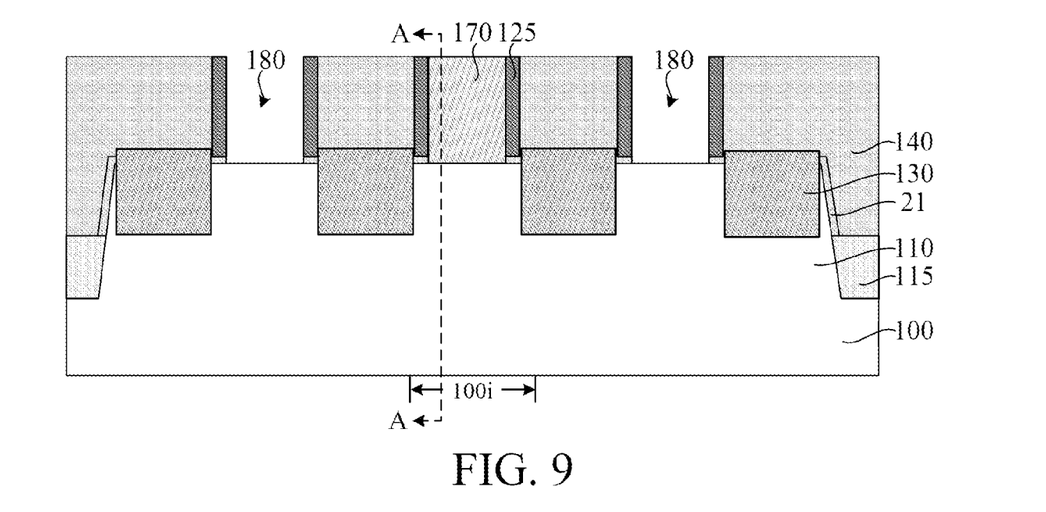
Figure 10:
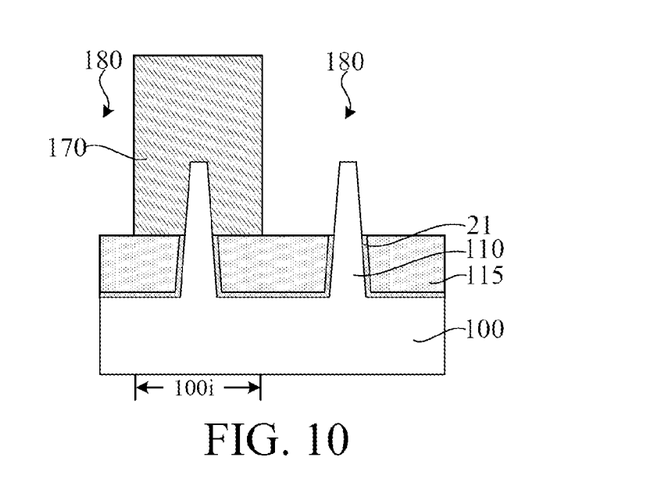

Referring to FIG. 9 and FIG. 10, FIG. 10 is a cross-sectional view in an AA direction of FIG. 9. After the isolation structure 170 is formed, the remaining dummy gate structure 120 is removed, and a gate opening 180 is formed in the interlayer dielectric layer 140.

The gate opening 180 is configured to provide a spatial position for formation of a gate structure.

In this form, in a direction perpendicular to an extending direction of the fin 110, the gate opening 180 adjacent to the isolation structure 170 is isolated by the isolation structure 170.

In this form, a process of removing the remaining dummy gate structure 120 includes at least one of a wet etching process or a dry etching process.

In this form, the step of removing the remaining dummy gate structure 120 further includes: removing the gate oxide layer 21 located below the remaining dummy gate structure 120, to expose the top surface and the side wall of the fin 110.

Figure 11:
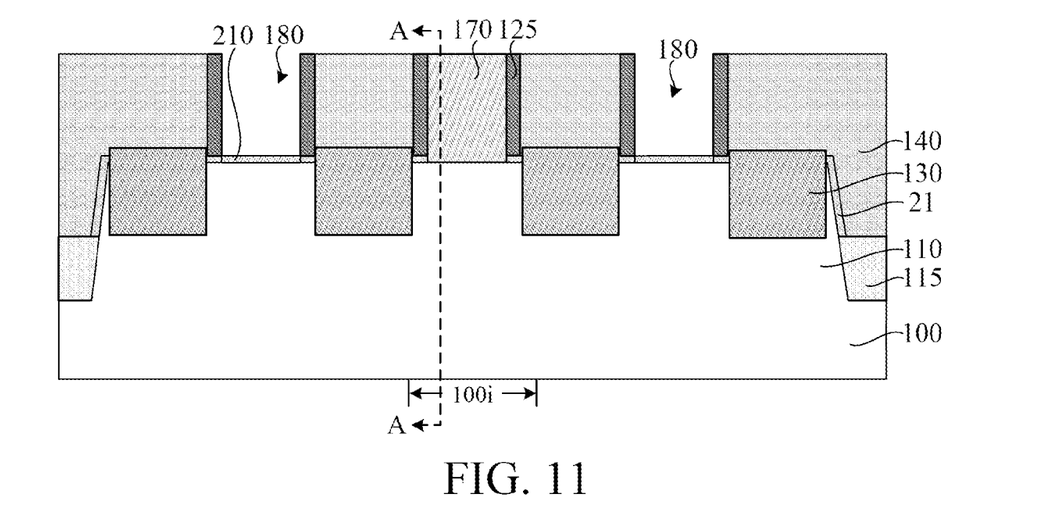
Figure 12:
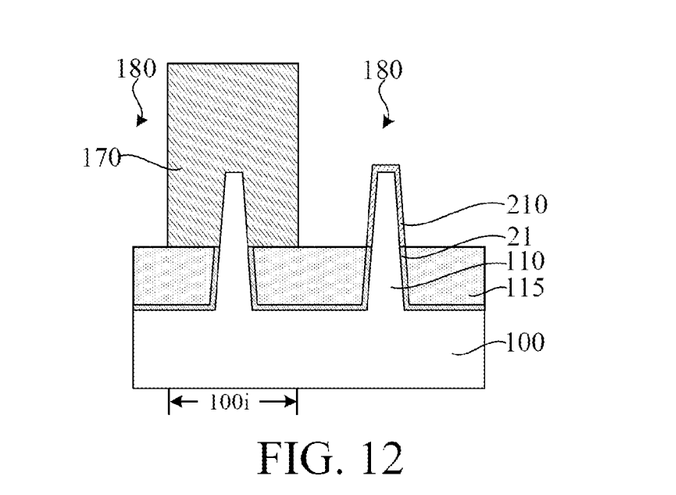

Referring to FIG. 11 and FIG. 12, FIG. 12 is a cross-sectional view in an AA direction of FIG. 11. In this form, the method for forming a semiconductor structure further includes: forming a gate dielectric layer 210 on the top surface and the side wall of the fin 110 exposed by the gate opening 180 after the gate opening 180 is formed.

The gate dielectric layer 210 is configured to isolate the subsequent gate structure and the fin 110.

In this form, the gate dielectric layer 210 includes a gate oxide layer. A material of the gate oxide layer is silicon oxide or silicon oxynitride.

In other forms, the gate dielectric layer may be alternatively a high-k gate dielectric layer, or, the gate dielectric layer may include a gate oxide layer and a high-k gate dielectric layer located on the gate oxide layer. The material of the high-k gate dielectric layer is a high-k dielectric material, where the high-k dielectric material is a dielectric material having a relative dielectric constant greater than a relative dielectric constant of silicon oxide. Specifically, the material of the high-k gate dielectric layer is $HfO_2$. In other forms, the material of the high-k gate dielectric layer may be alternatively selected from $ZrO_2$, HfSiO, HfSiON, HfTaO, HfTiO, HfZrO or $Al_2O_3$.

In an example, the gate dielectric layer 210 is the gate oxide layer, and a process of forming the gate oxide layer includes an in-situ stream generation (ISSG) process or an ALD process.

In this form, the method for forming a semiconductor structure further includes: performing a first heat treatment on the gate dielectric layer 210 after the gate dielectric layer 210 is formed, where the first heat treatment being used for improving crystal quality of the gate dielectric layer 210, thereby improving reliability of a device.

In a process of the first heat treatment, the doped ions in the isolation doped region are further diffused, thereby obtaining an isolation doped region with a less steep concentration gradient and an isolation doped region with a larger doping profile.

In this form, a temperature of the first heat treatment is 800° C. to 950° C. The temperature of the first heat treatment is set to 800° C. to 950° C., and is used for improving film formation quality of the gate dielectric layer 210. For example, a density of the gate dielectric layer 210 is improved and defects such as impurities in the gate dielectric layer 210 are reduced, to obtain the gate dielectric layer 210 with better electrical performance.

Figure 13:
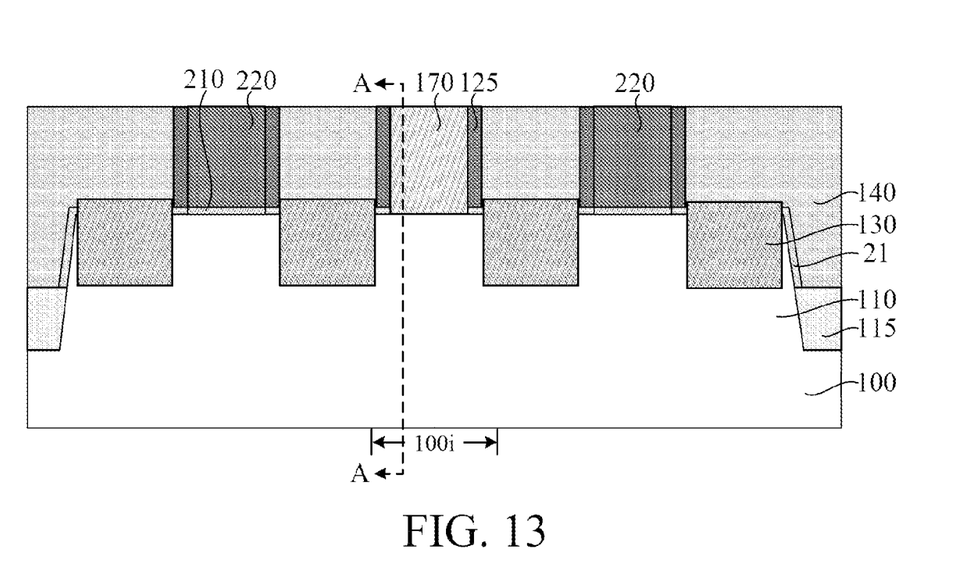
Figure 14:
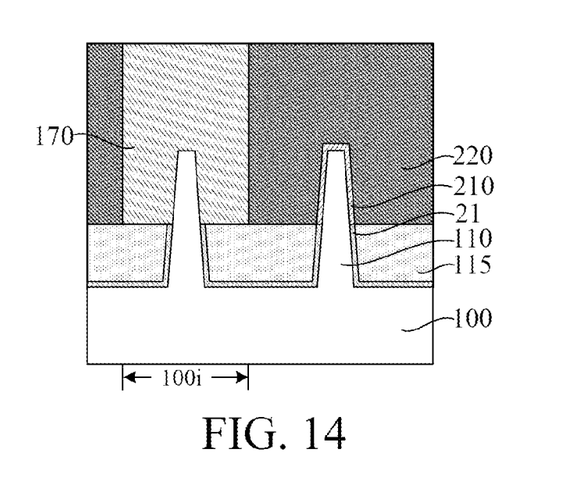

Referring to FIG. 13 and FIG. 14, FIG. 14 is a cross-sectional view in an AA direction of FIG. 13. A gate structure 220 is formed in the gate opening 180.

The gate structure 220 is configured to control the opening and closing of a conductive channel of a FET.

In this form, the gate structure 220 is located on the isolation layer 115, and covers a part of the top of and a part of the side wall of the fin 110.

In this form, in an extending direction of the gate structure 220, the gate structure 220 adjacent to the isolation structure 170 is isolated by the isolation structure 170. The extending direction of the gate structure 220 is perpendicular to the extending direction of the fin 110.

In this form, the gate structure 220 is a metal gate structure, and the gate structure 220 is formed by a high k last metal gate last process. The gate structure 220 includes a work function layer (not shown in the figure) and a gate electrode layer (not shown in the figure) located on the work function layer.

The work function layer is configured to adjust a work function of the gate structure 220, thereby adjusting a threshold voltage of the device. When a PMOS device is formed, the work function layer is a P-type work function layer, and the material of the P-type work function layer includes one or more of TiN, Ta, TaN, TaSiN and TiSiN; and when an NMOS device is formed, the work function layer is an N-type work function layer, and the material of the N-type work function metal includes one or more of TiAl, TaAlN, TiAlN, MoN, TaCN, and AlN.

The gate electrode layer is used as an electrode for leading out the electricity of the gate structure 220, thereby electrically connecting the gate structure 220 to external circuits or other interconnection structures. A material of the gate electrode layer is a conductive material, for example: Al, Cu, Ag, Au, Pt, Ni, Ti, or W. In this form, the material of the gate electrode layer is W.

In other forms, the gate structure may be alternatively a polysilicon gate structure.

It should be noted that, in this form, after the gate structure 220 is formed, the method for forming a semiconductor structure further includes: performing a second heat treatment on the isolation doped region.

The second heat treatment is used for activating the doped ions in the isolation doped region.

A temperature of the second heat treatment should be neither excessively low nor excessively high. If the temperature of the second heat treatment is excessively low, an effect of activating the doped ions in the isolation doped region tends to decrease. If the temperature of the second heat treatment is excessively high, the structure of the device is prone to damage, and the doping profile of the doped region formed in the semiconductor structure is also prone to damage. To this end, in this form, the temperature of the second heat treatment is 450° C. to 650° C.

In this form, the second heat treatment is performed by using an annealing process. Specifically, the second heat treatment includes: an RTA process, a DSA process or a laser anneal process.

It should be noted that, after the gate structure 220 is formed and before the second heat treatment is performed on the isolation doped region, the method for forming a semiconductor structure further includes: forming a source-drain opening (not shown in the figure) penetrating the interlayer dielectric layer 140 at the top of the source-drain doped region 130, where the source-drain opening exposes the source-drain doped region 130; and performing second ion doping on the source-drain doped region 130 exposed by the source-drain opening, where a doping type of the second ion doping is the same as a doping type of the source-drain doped region 130.

In this form, the second ion doping is performed through the source-drain doped region 130 exposed by the source-drain opening, the doping type of the second ion doping is the same as the doping type of the source-drain doped region 130, to improve the ion doping concentration in the source-drain doped region 130, and to reduce a resistance on a surface of the source-drain doped region 130. In addition, in a subsequent process of forming, in the source-drain opening, a source-drain contact layer in contact with the source-drain doped region 130, it is also beneficial to reducing a contact resistance between the source-drain doped region 130 and the source-drain contact layer, thereby improving performance of the semiconductor structure.

Accordingly, in this form, in the step of performing the second heat treatment, the second heat treatment may further activate the doped irons of the second ion doping in the source-drain doped region 130, so that the solution of this embodiment and process steps in the prior art are integrated, to improve process integration and process compatibility. Moreover, there is no need to add an additional heat treatment step, which is beneficial to reducing process costs.

Accordingly, after the second heat treatment is performed, forms of the method for forming a semiconductor structure further include: forming, in the source-drain opening (not shown in the figure), a source-drain contact layer in contact with the source-drain doped region 130.

The source-drain contact layer is configured to electrically connect the second source-drain doped region 130 to external circuits or other interconnection structures. A material of the source-drain contact layer is a conductive material such as W, Al, Cu, Ag or Au.

Although forms of the present disclosure are described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A method for forming a semiconductor structure, comprising:
   providing a base, comprising:
      an isolation region corresponding to a fin cut position, a substrate and a fin protruding from the substrate, the fin being a continuous structure,
      a dummy gate structure extending across the fin formed on the substrate,
      a source-drain doped region formed in the fin on two sides of the dummy gate structure, and
      an interlayer dielectric layer covering a side wall of the dummy gate structure, where the source-drain doped region is formed on the substrate;
   removing the dummy gate structure located at the isolation region, to form an isolation opening, to expose a top and a side wall of the fin located at the isolation region;
   performing first ion doping on the fin below the isolation opening, to form an isolation doped region in the fin, wherein a doping type of the isolation doped region is different from a doping type of the source-drain doped region;
   filling an isolation structure in the isolation opening after the first ion doping is performed, wherein the isolation structure extends across the fin of the isolation region;
   removing the remaining dummy gate structure after the isolation structure is formed, to form a gate opening in the interlayer dielectric layer; and
   forming a gate structure in the gate opening; and
   after the gate structure is formed, performing a second heat treatment on the isolation doped region.

2. The method for forming a semiconductor structure according to claim 1, wherein:
   the source-drain doped region is N-type doping, the fin below the isolation opening is doped with P-type ions, and the P-type ions comprise boron ions, gallium ions or indium ions; or
   the source-drain doped region is P-type doping, the fin below the isolation opening is doped with N-type ions, and the N-type ions comprise phosphorus ions, arsenic ions or antimony ions.

3. The method for forming a semiconductor structure according to claim 1, wherein the first ion doping is performed on the fin below the isolation opening using an ion implantation process.

4. The method for forming a semiconductor structure according to claim 3, wherein:
   the source-drain doped region is N-type doping, ions of the ion implantation are boron ions, and parameters of the ion implantation process comprise: implantation energy of 3 keV to 8 keV, an implantation dose of $2.0E14$ $cm^{-2}$ to $1.0E15$ $cm^{-2}$; and an implantation angle of 3° to 20°; or the source-drain doped region is P-type doping, ions of the ion implantation are phosphorus ions, and parameters of the ion implantation process comprise: implantation energy of 3 keV to 8 keV, an implantation dose of $1.0E14$ $cm^{-2}$ to $6.0E14$ $cm^{-2}$; and an implantation angle of 3° to 20°.

5. The method for forming a semiconductor structure according to claim 1, wherein a process of removing the dummy gate structure located at the isolation region comprises a dry etching process.

6. The method for forming a semiconductor structure according to claim 1, further comprising: forming a gate dielectric layer on a top surface and the side wall of the fin exposed by the gate opening after the gate opening is formed and before the gate structure is formed.

7. The method for forming a semiconductor structure according to claim 6, wherein the gate dielectric layer comprises a gate oxide layer.

8. The method for forming a semiconductor structure according to claim 6, further comprising: performing a first heat treatment on the gate dielectric layer after the gate dielectric layer is formed and before the gate structure is formed.

9. The method for forming a semiconductor structure according to claim 8, wherein a temperature of the first heat treatment is 800° C. to 950° C.

10. The method for forming a semiconductor structure according to claim 1, wherein a temperature of the second heat treatment is 450° C. to 650° C.

11. The method for forming a semiconductor structure according to claim 1, wherein the second heat treatment comprises: a rapid thermal anneal (RTA) process, a dynamic surface anneal (DSA) process or a laser anneal process.

12. The method for forming a semiconductor structure according to claim 1, wherein:
    after the gate structure is formed and before the second heat treatment is performed on the isolation doped region, the method for forming a semiconductor structure further comprises:
    forming a source-drain opening penetrating the interlayer dielectric layer at the top of the source-drain doped region, wherein the source-drain opening exposes the source-drain doped region; and
    performing second ion doping on the source-drain doped region exposed by the source-drain opening, wherein a doping type of the second ion doping is the same as a doping type of the source-drain doped region; and
    after the second heat treatment is performed, the method for forming a semiconductor structure further comprises: forming, in the source-drain opening, a source-drain contact layer in contact with the source-drain doped region.

13. The method for forming a semiconductor structure according to claim 1, wherein the step of filling an isolation structure in the isolation opening comprises:
    forming an isolation material layer filling the isolation opening, wherein the isolation material layer is further located on the interlayer dielectric layer and the dummy gate structure; and
    removing the isolation material layer on the interlayer dielectric layer and a top surface of the dummy gate structure, wherein the remaining isolation material layer located in the isolation opening is used as the isolation structure.

14. The method for forming a semiconductor structure according to claim 13, wherein a process of forming the isolation material layer comprises at least one of a chemical vapor deposition (CVD) process, an atomic layer deposition (ALD) process, a flowable chemical vapor deposition (FCVD) process, a plasma-enhanced chemical vapor deposition (PECVD) process, or a high aspect ratio process (HARP).

15. The method for forming a semiconductor structure according to claim 13, wherein the isolation material layer on the interlayer dielectric layer and the top surface of the dummy gate structure is removed using a planarization process.

16. The method for forming a semiconductor structure according to claim 1, wherein a process temperature of performing the first ion doping on the fin below the isolation opening is 100° C. to 200° C.

17. The method for forming a semiconductor structure according to claim 1, wherein a material of the isolation structure comprises at least one of silicon oxide, silicon nitride, silicon oxynitride, silicon oxycarbide, silicon carbonitride, or silicon oxycarbonitride.

18. The method for forming a semiconductor structure according to claim 1, wherein the gate structure is a metal gate structure.

* * * * *